(12) United States Patent  (10) Patent No.: US 7,241,700 B1
En et al.  (45) Date of Patent: Jul. 10, 2007

(54) METHODS FOR POST OFFSET SPACER CLEAN FOR IMPROVED SELECTIVE EPITAXY SILICON GROWTH

(75) Inventors: William George En, Milpitas, CA (US); Eric N. Paton, Morgan Hills, CA (US); Scott D. Luning, Poughkeepsie, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/969,769

(22) Filed: Oct. 20, 2004

(51) Int. Cl.
*H01L 21/302* (2006.01)
*H01L 21/461* (2006.01)

(52) U.S. Cl. ............... 438/745; 438/341; 257/E21.09; 257/E21.02

(58) Field of Classification Search ............ 438/745, 438/311, 341, 357, 363; 257/E21.09, E21.092, 257/E21.02
See application file for complete search history.

(56) References Cited

U.S. PATENT DOCUMENTS

| | | | |
|---|---|---|---|
| 4,933,295 A | 6/1990 | Feist | |
| 5,298,454 A | 3/1994 | D'Asaro et al. | |
| 5,319,232 A | 6/1994 | Pfiester | |
| 5,387,309 A | 2/1995 | Bobel et al. | |
| 5,556,462 A | 9/1996 | Celii et al. | |
| 5,670,018 A | 9/1997 | Eckstein et al. | |
| 5,696,012 A | 12/1997 | Son | |
| 5,710,450 A | 1/1998 | Chau et al. | |
| 5,773,328 A | 6/1998 | Blanchard | |
| 5,854,136 A | 12/1998 | Huang et al. | |
| 5,902,125 A | 5/1999 | Wu | |
| 5,956,590 A * | 9/1999 | Hsieh et al. ............ | 438/303 |
| 6,024,794 A | 2/2000 | Tamamura et al. | |
| 6,074,939 A | 6/2000 | Watanabe | |
| 6,133,093 A | 10/2000 | Prinz et al. | |
| 6,159,422 A | 12/2000 | Graves et al. | |
| 6,165,826 A | 12/2000 | Chau et al. | |
| 6,165,857 A | 12/2000 | Yeh et al. | |
| 6,228,730 B1 | 5/2001 | Chen et al. | |
| 6,251,764 B1 | 6/2001 | Pradeep et al. | |
| 6,277,700 B1 | 8/2001 | Yu et al. | |
| 6,313,017 B1 | 11/2001 | Varhue | |
| 6,346,447 B1 | 2/2002 | Rodder | |
| 6,346,468 B1 | 2/2002 | Pradeep et al. | |
| 6,380,043 B1 | 4/2002 | Yu | |
| 6,403,434 B1 | 6/2002 | Yu | |
| 6,436,841 B1 | 8/2002 | Tsai et al. | |
| 6,440,851 B1 | 8/2002 | Agnello et al. | |
| 6,444,578 B1 | 9/2002 | Cabral et al. | |
| 6,451,693 B1 * | 9/2002 | Woo et al. ............... | 438/682 |

(Continued)

FOREIGN PATENT DOCUMENTS

JP  06326049 A  11/1994

OTHER PUBLICATIONS

Nojiri, et al. "Bias-Dependent Etching of Silicon In Aqueous Ammonia," Central Engineering Lab. Nissan Motor Co., 1991IEEE, pp. 136-139, Yokosuka, Japan.

(Continued)

*Primary Examiner*—Caridad Everhart

(57) ABSTRACT

A gate structure is formed overlying a substrate. A source/drain region of the substrate is exposed to a solution comprising ammonium hydroxide, hydrogen peroxide, and deionized water to etch an upper-most semiconductor porton of the source/drain region.

24 Claims, 5 Drawing Sheets

U.S. PATENT DOCUMENTS

| | | |
|---|---|---|
| 6,479,358 B1 | 11/2002 | Yu |
| 6,679,946 B1 | 1/2004 | Jackson et al. |
| 6,726,767 B1 | 4/2004 | Marrs et al. |
| 6,777,759 B1 | 8/2004 | Chau et al. |
| 6,890,391 B2 * | 5/2005 | Aoki et al. ............... 134/32 |
| 6,924,518 B2 | 8/2005 | Iinuma et al. |
| 6,946,371 B2 | 9/2005 | Langdo et al. |
| 6,979,622 B1 | 12/2005 | Thean et al. |
| 7,014,788 B1 | 3/2006 | Fujimura et al. |
| 2001/0012693 A1 | 8/2001 | Talwar et al. |
| 2002/0135017 A1 * | 9/2002 | Vogt et al. ............... 257/351 |
| 2002/0137297 A1 | 9/2002 | Kunikiyo |
| 2002/0142616 A1 * | 10/2002 | Giewont et al. ........... 438/745 |
| 2002/0171107 A1 | 11/2002 | Cheng et al. |
| 2003/0042515 A1 | 3/2003 | Xiang et al. |
| 2003/0098479 A1 | 5/2003 | Murthy et al. |
| 2004/0041216 A1 | 3/2004 | Mori et al. |
| 2004/0119102 A1 | 6/2004 | Chan et al. |
| 2005/0121719 A1 | 6/2005 | Mori |
| 2005/0252443 A1 | 11/2005 | Tsai et al. |

OTHER PUBLICATIONS

Branebjerg, et al. "Dopant Selective HF Anodic Etching of Silicon," Mesa-Institute, University of Twente, 1991 IEEE, pp. 221-226, Enschede, The Netherlands.

Wang, et al., "Selective Etching of N-Type silicon Using Pulsed Potential Anodization," General Motors Research Lab., 1991 IEEE, pp. 819-822, Warren, Michigan.

van den Meerakker, et al., "A Mechanistic tudy of Silicon Etchingin NH3/H2O2 Cleaning Solutions," Philips Research Lab., J. Electrochem. Soc., vol. 137, No. 4, pp. 1239-1243 Eindhoven The Netherlands.

Besser, et al., "Silicides For The 65 nm Technology Node," MRS symposum Proc. 766 (2003), Technology Development Group, Advanced Micro Devices, Inc. Austin, TX.

Van Meer et al., "70 nm Fully-Depleted SOI CMOS Using A New Fabrication Scheme: The Spacer/Replacer Scheme," IMEC, Leuven, Belgium, (Jun. 2002).

Wolf et al., "Silicon Processing for the VLSI Era vol. 1: Process Technology", ISBN 0-961672-3-7, University of California, Sunset Beach, California, pp. 521-542, (1986).

Chau et al., "A 50nm Depleted-Substrate CMOS Transistor (DST)," 2001 IEEE, Intel Corporation, Hillsboro, Oregon, (2001).

Cohen et al., "A Self-Aligned Silicide Process Utilizing ION Implants for Reduced Silicon Consumption And Control of the Silicide Formation Temperature," vol. 716, 2002 Materials Research Society, pp. B1.7.1-B1.7.6, Yorktown Heights, New York, (2002).

Ghani et al., "A 90nm High Volume Manufacturing Logic Technology Featuring Novel 45nm Gate Length Strained Silicon CMOS Transistors," 2003 IEEE, 3 pages, (2003).

van den Meerakker, et al., "A Mechanistic tudy of Silicon Etchingin NH3/H202 Cleaning Solutions," Philips Research Lab., J. Electrochem. Soc., vol. 137, No. 4, pp. 1239-1243 Eindhoven The Netherlands, Apr. 1990).

* cited by examiner

METHODS FOR POST OFFSET SPACER CLEAN FOR IMPROVED SELECTIVE EPITAXY SILICON GROWTH

CROSS-REFERENCE TO RELATED APPLICATION(S)

Related subject matter is found in a copending U.S. patent application, application Ser. No. 10/969,771, filed Oct. 20, 2004, entitled "Method of cleaning a surface of a semiconductor substrate", and having at least one inventor in common with the present application.

FIELD OF THE DISCLOSURE

The present disclosure relates generally to a semiconductor manufacturing process, and more particularly to methods for cleaning devices during a manufacturing process.

DESCRIPTION OF THE RELATED ART

CMOS manufacturing processes through formation of raised source drain regions via selective epitaxial growth (SEG) typically proceed by deposition, patterning and etch of a gate structure, followed by deposition and blanket etch toward formation of a single set or several sets of spacers adjacent to the gate structure sidewalls. These spacers are generally referred to as offset spacers as they serve to offset the distance from the gate sidewalls to the source/drain extension regions during ion implantation of the source/drain extension regions.

Formation of offset spacers is generally by anisotropic etching, which creates surface contamination, near-surface contamination, and damage to the source/drain regions. Current offset spacer formation processes necessitate additional, post offset spacer formation cleaning processes to remove the surface contaminants and surface damage prior to additional processing and prior to selective epitaxial growth. Typical post-offset spacer cleaning utilizes a plasma clean in an oxidizing ambient atmosphere, or a hydrofluoric acid (HF) cleaning process. An HF cleaning cannot be employed when the offset spacers are an oxide, as this would result in removal of the offset spacer. Because the typical post-offset spacer clean occurs in an oxidizing ambient atmosphere, further cleaning must be conducted prior to selective epitaxial growth, adding to the manufacturing cycle time, and the cumulative damage effects during device fabrication.

Therefore a method that overcomes these problems would be useful.

BRIEF DESCRIPTION OF THE DRAWINGS

The present disclosure may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present disclosure provides a method for manufacturing a semiconductor device utilizing a cleaning process following offset spacer formation which results in a surface suitable for selective epitaxial growth (SEG) and does not require an additional post-offset spacer clean. In addition to the time- and cost-savings provided by the elimination of an additional post-offset spacer cleaning, the method disclosed results in lower selective epitaxy temperature, which has been correlated with higher device drive current, thus increasing operating speeds and ranges.

The cleaning processes detailed in the present disclosure serve to clean the surface of a semiconductor device by removing contamination such as carbonaceous residue, subsurface oxygen, and other impurities. These contaminants hinder the SEG process. The cleaning processes disclosed herein allow for a lower temperature $H_2$ bake because, following the cleaning processes, the semiconductor devices' surface contamination is lower, thus a higher temperature $H_2$ bake is no longer required. Higher $H_2$ bake temperatures should be avoided, as dopant diffusion and/or dopant deactivation may occur within doped components of the device, e.g., source/drain extensions or polysilicon gates.

Figure 1:
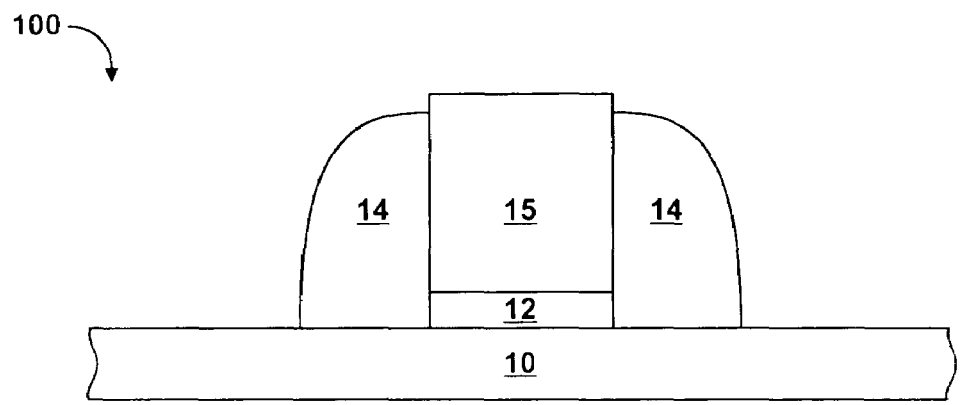
FIGS. 1 through 12 illustrate, in cross-section, semiconductor device manufacturing process steps according to at least one embodiment of the present disclosure.

At the stage of manufacture illustrated in FIG. 1, a cross-sectional view of a portion 100 of a semiconductor device, a conductive gate portion 15 has been formed over a gate oxide 12 and overlying a semiconductor substrate 10. Semiconductor substrate 10 can be a mono-crystalline silicon substrate, or can also be other materials, e.g., silicon-on-insulator, silicon on sapphire, gallium arsenide, or the like. Conductive gate portion 15 is preferably poly-crystalline or amorphous silicon having a width ranging from 350–500 Angstroms, and a height ranging from 900–1200 Angstroms. Gate oxide 12 typically comprises a thermal silicon oxide ranging in thickness from 10–25 Angstroms.

Figure 2:
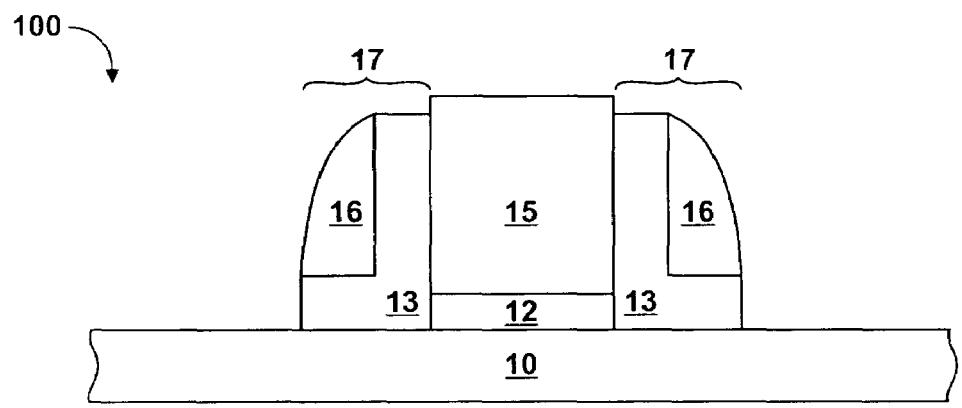

Following blanket deposition of spacer material and etch, offset spacers are formed immediately adjacent to conductive gate portion 15 sidewalls. In an embodiment, a single layer spacer material such as a nitride is utilized to form a single material layer offset spacer 14. Alternately, more than one deposition and etch may be employed to create a dual material layer offset spacer 17, as illustrated in FIG. 2. The example illustration of FIG. 2 shows a first material layer 13, and a second material layer 16. The resulting combined layers 13, 16, or layer stack, together comprise the offset spacer 17. In an embodiment, spacer material layer 13 is an oxide, and spacer material 16 is a nitride, although this order may be reversed, or the two layers may be comprised of the same material. It should be noted that although two layers of material are illustrated as comprising offset spacer 17, more than two layers may be utilized to form the offset spacer 17. Adjacent to either side of the gate structures of FIGS. 1 and 2 are regions where a transistor source and drain are to be formed. These regions are referred to generally as source/drain region. In one embodiment, offset spacers such as 14 and 17 are utilized to demarcate a source/drain extension implantation region.

Following formation of single or multiple layer offset spacers 14 or 17, the source/drain portions of the substrate 10 of portion 100 are exposed to a cleaning process comprising hydrofluoric acid, ammonium hydroxide, hydrogen peroxide, and deionized water mixture. An epitaxial layer such as epitaxial layer 28 (FIG. 12) will be formed overlying the source/drain regions after the source/drain regions have been exposed to the cleaning process. In an embodiment, the source/drain extension regions undergo dopant implantation prior to formation of the epitaxial layer. In a further embodiment, the source/drain extension regions undergo dopant implantation following the step of formation of the epitaxial layer. In another embodiment, the source/drain regions of the substrate 10 are implanted with a dopant prior to exposing portion 100 to the cleaning process disclosed herein.

Figure 3:
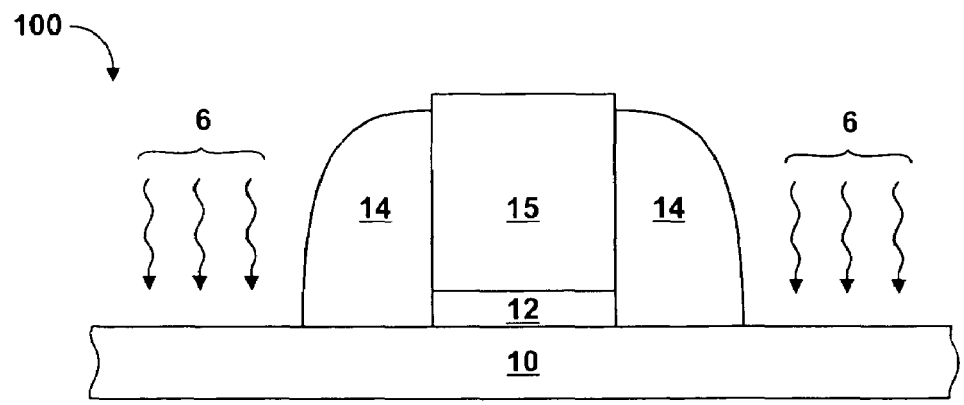

FIG. 3 illustrates portion 100 undergoing exposure to a cleaning process as embodied herein. The cleaning process comprises a first pre-rinse with deionized water, followed by an oxide etch 6 utilizing an aqueous solution of deionized water and hydrofluoric acid (HF or hydrogen fluoride in water) aqueous solution of approximately 30:1 (volumetric ratio) at 21 degrees Celsius, for a time period ranging from between 50–60 seconds. The weight percentage of HF recommended for the HF aqueous solution is 49% in a balance of deionized water ($H_2O$). Bulk HF aqueous solution can be purchased from various chemical suppliers in the HF weight percent range of 10% to 49%. In semiconductor fabrication facilities, this aqueous HF aqueous solution is typically diluted in the range 10:1 to 200:1. A 10:1 HF is 1 part aqueous HF (at 49% weight percent) and 10 parts $H_2O$. It will be appreciated that the etch rate of the HF aqueous solution is substantially linear with respect to both the concentration of the HF aqueous solution and the etch time. Therefore, various combinations of HF concentrations and etch times can be used to accomplish the oxide etch. Additionally, the temperature may vary.

After the HF etch, an overflow rinse utilizing deionized water is performed for a period ranging from approximately 120 to 600 seconds with a typical rinse being about 400 seconds. The cleaning process of portion 100 results in etching away of the surface contamination/debris located on substrate 10 resulting from offset spacer formation and/or dopant implantation. The upper semiconductor surface, i.e. silicon surface, of substrate 10 is also slightly etched, for example, from one to several mono layers of silicon, during the HF etch 6, as illustrated by FIG. 4.

Figure 4:
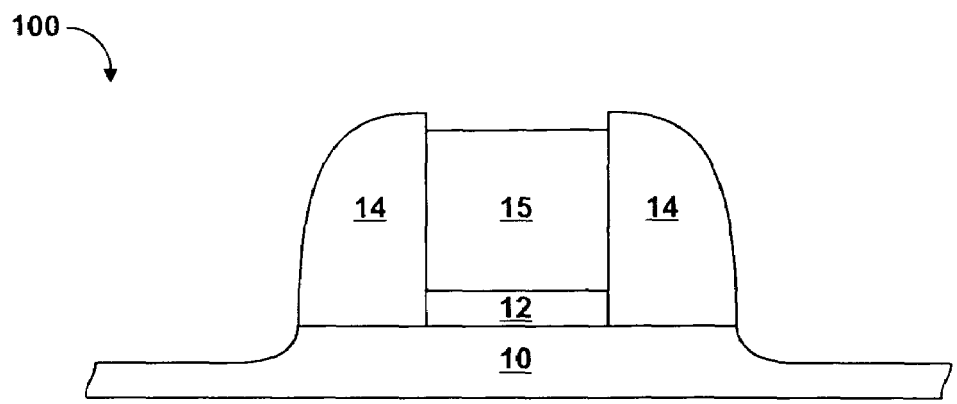

FIG. 4 illustrates portion 100 following the HF etch 6 (FIG. 3). It should be noted that the amount of material removed during the HF etch 6 is dependent upon the type of material being removed. For example, when native oxide is present, the HF etch 6 will remove approximately 20 to 30 Angstroms of oxide. If a deposited oxide layer is present in addition to a native oxide, an over-etch of approximately 30% is generally desirable. For example, if removal of 100 Angstroms of a chemical vapor deposition (CVD) oxide is desired, the HF etch 6 could be employed to remove approximately 120 to 130 Angstroms oxide removal. This latter example would be applicable in applications where a liner oxide of approximately 100 Angstroms thickness is employed between the gate 25 and the nitride spacer 14.

Figure 5:
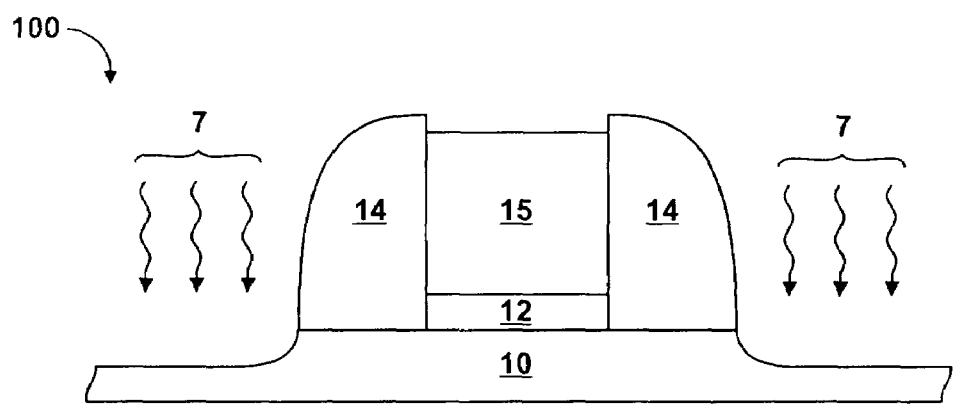
Figure 6:
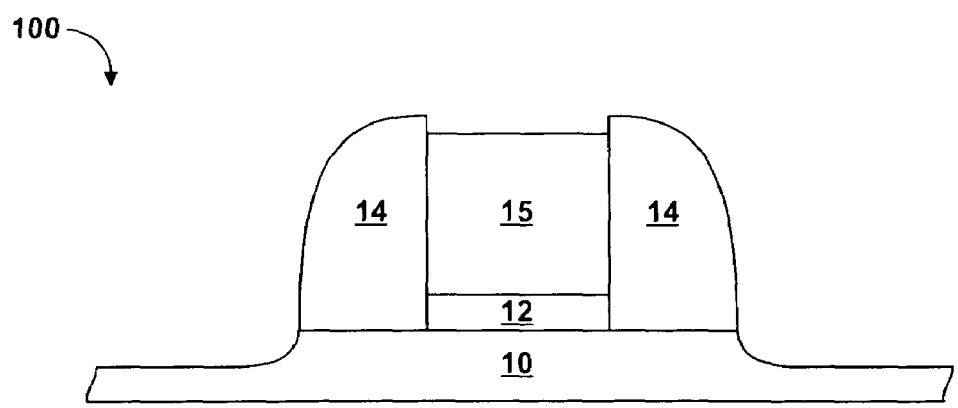
Figure 7:
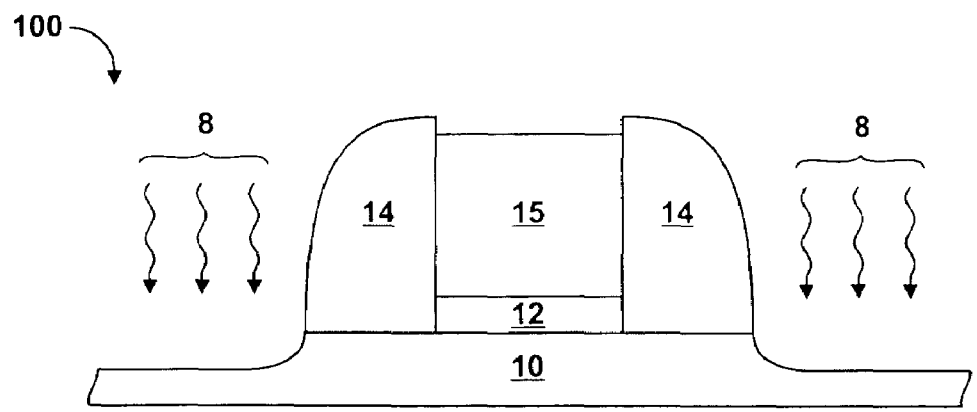

FIGS. 5 through 7 illustrate the next steps in the cleaning process of portion 100. A second pre-rinse with deionized water of approximately 30 seconds duration precedes the performance of a Standard Clean-1 (SC-1), a quick dry rinse (QDR), and a Standard Clean-2 (SC-2). The SC-1 and SC-2 components of the cleaning process are denoted by item number 7 in FIG. 5. The SC-1 and SC-2 components 7 are followed by a second QDR (not illustrated), and an HF: $H_2O$ etch (item 8, FIG. 7), a third rinse, and an isopropyl alcohol (IPA) dry. The amount of material removed by the SC-1 and SC-2 components etch ranges from approximately one monolayer of silicon to about 10 to 100 Angstroms.

In an embodiment, the SC-1 utilizes an aqueous solution of ammonium hydroxide: hydrogen peroxide: deionized water at a ratio of approximately 1:1–4:6–40, at a temperature of approximately 60 degrees Celsius for approximately 72 minutes, to etch approximately 100 Angstroms of silicon. Synonyms for ammonium hydroxide ($NH_4OH$) include ammonia solution (typically contains between 12% and 44% ammonia before dilution), dilute ammonia, or concentrated ammonia. A first quick dry rinse is conducted for approximately 3 minutes. In an embodiment, the SC-2 utilizes a solution of hydrochloric acid: hydrogen peroxide: deionized water at an initial ratio of approximately 1:1:50 at a temperature of approximately 60 degrees for about 5 minutes. A second quick dry rinse is then conducted. Synonyms for hydrochloric acid (HCl) are hydrogen chloride, anhydrous hydrogen chloride, aqueous hydrogen chloride, chlorohydric acid, spirit of salts, and muriatic acid.

In a particular embodiment, the SC-1 utilizes a solution of ammonium hydroxide: hydrogen peroxide: deionized water at a ratio of approximately 1:4:20 at a temperature ranging of approximately 60 degrees Celsius for approximately 72 minutes. The SC-1 is the step in the clean sequence that etches the silicon. This occurs because the $H_2O_2$ (the oxidizer) becomes depleted in the solution with increasing time and increasing temperature. The methods of the present disclosure allow the initial concentration of hydrogen peroxide to be depleted to facilitate etching of the upper-most semiconductor portion. Depletion of the $H_2O_2$ is greatly enhanced when the solution temperature rises above 80 degrees Celsius, which can lead to an etch that is difficult to control if not carefully monitored. The temperature range of the SC-1 is expected to be approximately 55 to 85 degrees Celsius, with the etch occurring in a shorter period of time at higher temperatures than at lower temperatures. It is expected that the SC-1 etching will be better controlled at temperatures in the range of 55–80 degrees Celsius and better still at temperatures in the range of 55–75 degrees Celsius. Generally, it is expected that the substrate will be exposed to the SC-1 etch process for longer that 60 minutes. When the oxidizer stops protecting the silicon surface, the ammonium hydroxide ($NH_4OH$) starts to etch the silicon. Thus, a small amount of silicon can be etched in a controlled manner. The SC-1 can be performed in a re-usable bath where the solution is re-circulated and heated to maintain the desired temperature.

The mechanism of silicon and $SiO_2$ etching by a $NH_4OH/H_2O_2$ solution occurs when the solution is allowed to be depleted of $H_2O_2$. An alkaline solution, such as NH4OH4 in our example, will attack silicon by water molecules, according to the reaction:

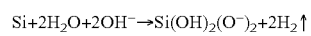

A passivation layer formed by the $H_2O_2$ prevents this attack by the $NH_4OH$. $H_2O_2$ decomposes in the course to form $O_2$ and $H_2O$.

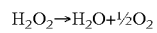

When the concentration of $H_2O_2$ is below $3 \times 10^{-3}$M, then silicon will begin to etch, because of the absence of the inhibition layer.

As indicated in the above equations, heat is given off as the $H_2O_2$ is depleted. If a bath is used that is not recharged with fresh solution all $H_2O_2$ will be depleted, thereby no longer releasing heat. Therefore, the temperature can be monitored on the low end to indicate when the solution should be refreshed, while the temperature on the high end is monitored to prevent unusually rapid decomposition of the $H_2O_2$, which can lead to a process that is difficult to control.

The first quick dry rinse is conducted for approximately 3 minutes. The subsequent SC-2 utilizes a solution of hydrochloric acid: hydrogen peroxide: deionized water at a ratio of approximately 1:1:50 at a temperature of approximately 60 degrees for about 5 minutes. A quick dry rinse with deionized water, followed by an IPA dry process, is performed following the SC-2.

The IPA dry process is an industry standard whereby the semiconductor wafers are lifted from the water rinse tank into a heated IPA vapor at 82 degrees Celsius. The IPA vapor is generated in a separate chamber with 100% $N_2$ bubbled through 100% IPA (heated to 82 degrees Celsius). The IPA condenses on the wafer, and the solution drips off the bottom of the wafer. The IPA vapor concentration is slowly diluted to 100% $N_2$ before the wafers are removed from the rinsing/drying tank.

Figure 8:
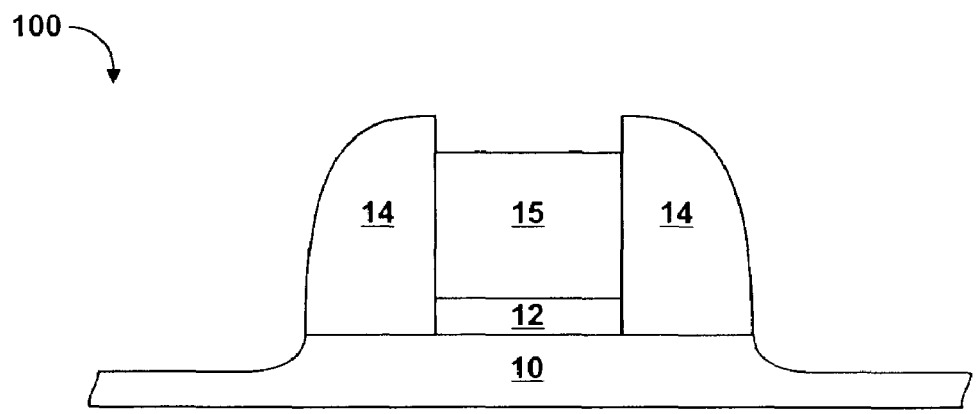

FIG. 6 illustrates the results of the SC-1, SC-2 etch upon portion 100. Substrate 10 has been further recessed (etched) as a result of the cleaning process. Portion 100 then undergoes an HF: H2O etch 8 as shown in FIG. 7. The H2O:HF etch 8 is conducted at an aqueous solution ratio of 200:1 for about 65 seconds, which typically results in approximately 30 Angstroms of oxide removal. The HF: H2O etch 8 is followed by a rinse with deionized water for approximately 10 minutes duration. The deionized water rinse is followed by an IPA dry as described in the preceding paragraph. FIG. 8 illustrates portion 100 following the HF: H2O etch 8. The source/drain regions (item 30, FIG. 9) of substrate 10 are ready for ion implantation or selective epitaxial growth.

As seen in FIGS. 9 through 12, another embodiment of the present disclosure for a method of manufacturing a semiconductor device is presented. At the stage of manufacture illustrated in FIG. 9, a portion 200 of the semiconductor device has been formed comprising a gate structure 25 overlying a semiconductor substrate 20, an offset spacer 27 immediately adjacent the gate structure 25, and a source/drain extension region 30.

The gate structure 25 includes a conductive portion 25 and an insulative portion 22. Conductive portion 25 is preferably poly-crystalline or amorphous silicon having a width ranging from 250 to 10,000 Angstroms, and a height ranging from 500 to 2000 Angstroms. Insulative portion 22, the gate oxide, consists of a thermal silicon oxide ranging in thickness from 5 to 30 Angstroms. Semiconductor substrate 20 can be a mono-crystalline silicon substrate, or can also be other materials, e.g., silicon-on-insulator, silicon on sapphire, gallium arsenide, or the like.

Figure 9:
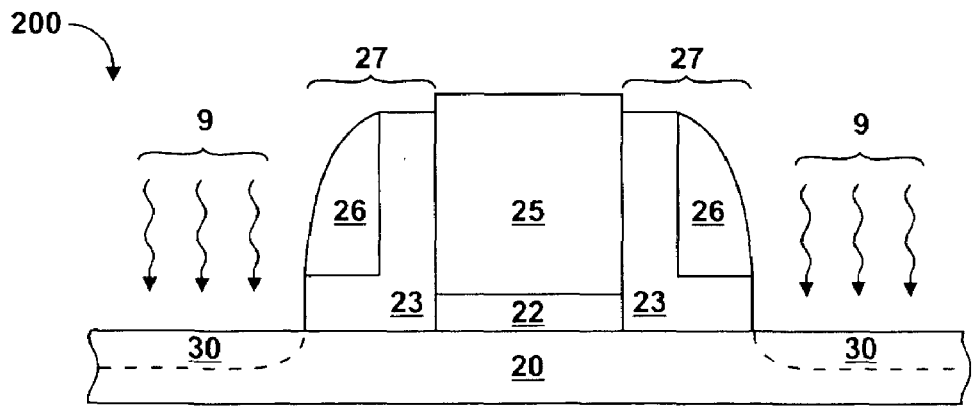

The offset spacer 27 illustrated in FIGS. 9 through 12 is a dual material layer offset spacer 27. The example illustrated in FIG. 9 shows a first material layer 23, and a second material layer 26. The resulting multiple layers 23, 26 together comprise the offset spacer 27. In an embodiment, spacer material layer 23 is an oxide, and spacer material 26 is a nitride, although this order may be reversed, or the two layers may be comprised of the same material. It should be noted that although two layers of material are illustrated as comprising offset spacer 27, fewer or more than two layers may be utilized to form the offset spacer 27. Offset spacers 27 serve to define the source/drain extension implantation regions 30.

Figure 10:
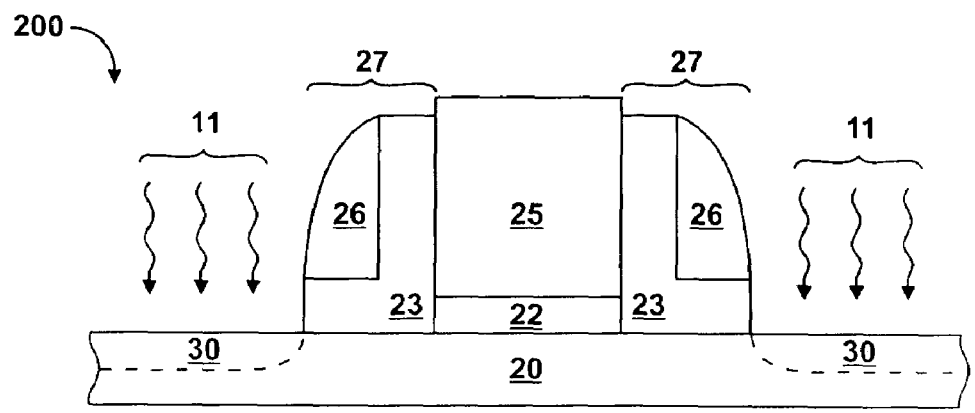

Portion 200 will undergo various steps in a cleaning process which will result in removal of portions of the surface of semiconductor substrate 20, as well as portions of the surface of conductive gate structure 25. In FIG. 9, portion 200 is undergoing an SC-1 cleaning process 9, which will be followed by an SC-2 cleaning process (not illustrated), and an oxide etch utilizing a solution of deionized water and hydrofluoric acid (HF) (FIG. 10). After the final step of the cleaning process, an epitaxial layer (FIG. 12) will be formed overlying the source/drain extension implantation regions 30.

In a particular embodiment, the SC-1 process 9 comprises a pre-rinse with deionized water of approximately 30 seconds duration. The pre-rinse is followed by a SC-1 solution 9 at a ratio of approximately 1:1–4:6–40, which includes the subranges of 0.25:1:5, 0.5:1:5, 1:1:5, 1:1:6, 1:4:20, and 1:1:40, ammonium hydroxide: hydrogen peroxide: deionized water at a temperature of approximately 60 degrees Celsius for approximately 5 minutes. A quick dry rinse (QDR) is then performed for approximately 3 minutes.

Following the SC-1 cleaning process, an SC-2 cleaning process is performed. In an embodiment, the SC-2 cleaning process includes utilizing an aqueous solution of hydrochloric acid: hydrogen peroxide: deionized water at a ratio of approximately 1:1:50 at a temperature of approximately 60 degrees Celsius for approximately 5 minutes. A QDR is then performed, and portion 200 is ready for the third cleaning, as illustrated in FIG. 10. The weight percent composition of the hydrochloric acid: hydrogen peroxide: deionized water is 29% (weight percent) hydrochloric acid and 30% (weight percent) hydrogen peroxide in a balance of deionized water.

Figure 11:
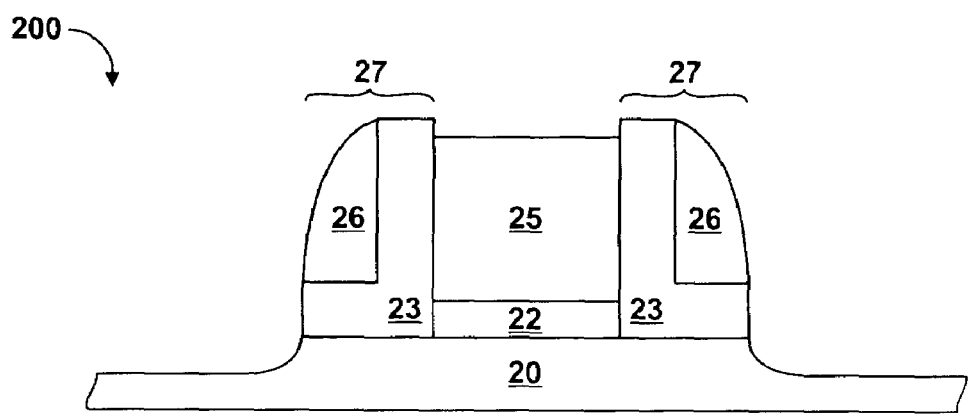

After the SC-1 and SC-2, a third cleaning process comprising an approximate 30 second pre-rinse, an oxide etch, an overflow rinse and an IP dry is performed, as shown in FIG. 10. The oxide etch is accomplished utilizing a solution 11 of deionized water and hydrofluoric acid at a ratio of approximately 200:1 for a time period ranging from between 450–650 seconds. Following the HF etch, an overflow rinse is performed for approximately 10 minutes. A final isopropyl alcohol (IPA) dry is then performed. Approximately 120–140 Angstroms of the surface of substrate 20 is removed in this process, as seen in FIG. 11. Portion 200 is ready to undergo selective epitaxial growth.

Figure 12:
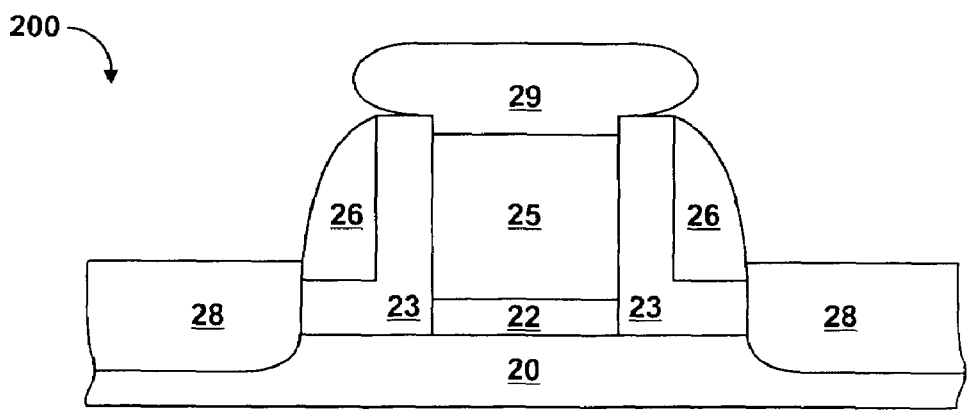

FIG. 12 illustrates the portion 200 of FIG. 11 following SEG formation. The SEG process has formed an epitaxial layer 28 overlying the substrate 20, as well as an SEG layer 29 over the surface of the gate structure 25. The etching process discussed with reference to FIGS. 9–11 etches the upper surface of the gate structure 25 in addition to the surface of the substrate 20. This produces a slightly recessed gate structure 25 surface, which, when SEG is conducted, results in the "mushroom-shaped" cap 29 atop the gate structure 25. This mushroom-shaped cap 29 is due, in part, to being confined by the offset spacers 27 during the SEG process.

Figure 13:
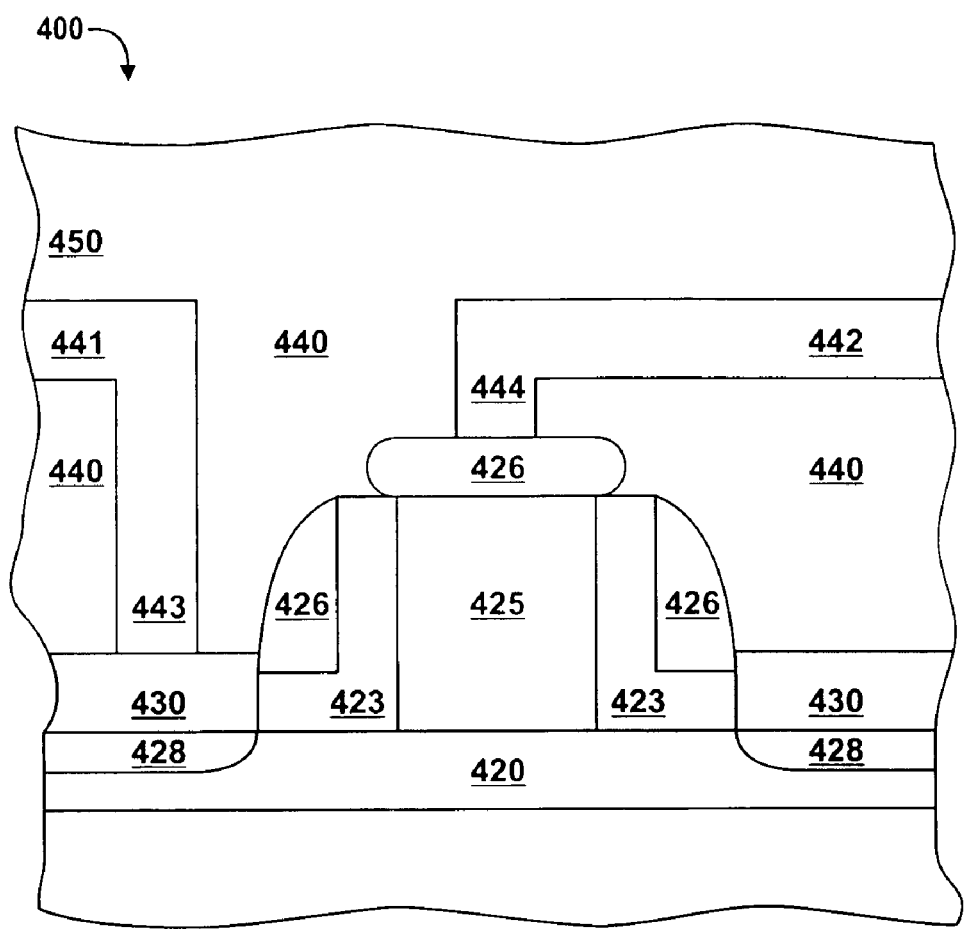
FIG. 13 illustrates a cross-sectional view of a portion of a semiconductor device manufactured according to at least one embodiment of the present disclosure.

FIG. 13 illustrates a cross-sectional view of a portion 400 of a semiconductor device manufactured according to an embodiment of the present disclosure. FIG. 13 is a simplified diagram that does not show all of the features, e.g., silicide regions, of portion 400 in order to keep the illustration from being cluttered. Illustrated features include interconnects 441 and 442 connected to vias/contacts 443 and 444 within interconnect dielectric region 440.

A passivation layer 450 has been formed overlying portion 400. The conductive gate structure 425 may include a gate stack comprising a dielectric layer (not shown) and/or an epitaxial layer 426. In FIG. 13, source drain regions 428 in the substrate 420, along with the epitaxial layer 430 are shown integrated into a transistor. The offset spacer shown in FIG. 13 is comprised of two material layers, layer 423 and layer 426. In other embodiments, the offset spacers can be a single material layer.

The above-described cleaning process has been found to facilitate formation of an epitaxial layer on a semiconductor surface, specifically silicon. Because various etch processes can etch N- and P-type regions at different rates, it can be useful to amorphize an upper-most surface of the source/drain regions prior to the above-described clean to reduce any preferential etch differences between substrate regions of differing dopant types.

For example, the above-described clean process can etch the N-type silicon preferentially, as compared to the P-type silicon, resulting in a quality difference of the SEG between the N and P regions after SEG processing. Etch rate differences between N- and P-type regions can allow for contaminates to remain in the lesser-etched region. For example, an etch process that does not etch P-type regions at the same rate as N-type regions can result in P-regions maintaining embedded carbon that is incorporated from previous process steps. Without appropriate etching of silicon in the P-type regions during the clean, the carbon will remain, and the SEG will grow inconsistently. A high bake temperature of 900° C. can be used to overcome this growth issue on P areas, however, as stated previously, high bake temperatures can be detrimental to the device in that it causes diffusion and deactivation of the dopants. Amorphizing the source/drain regions can reduce etch differences associated with the above-described cleaning process as well as other processes that are used to etch doped substrate regions, thereby improving the quality of both the N and P regions.

It has been hypothesized by the inventors that the etch bias between the N and P areas arises from the electronegativity difference (also called Electro-Motive Force EMF), between the N and P areas. This electrochemical behavior of silicon in aqueous ammonia solutions has been studied mostly with an emphasis on anodic dissolution. Selective etching of N-type and P-type silicon has been demonstrated, and the electrode potential measured with two electrolyte cells: the first containing the silicon substrate, and the second cell containing a reference electrode of Ag/AgCl. Many factors can influence which substrate is etched (dissolution reaction), and which is not etched (passivation reaction). N-type silicon will provide a supply of electrons to the reaction at the surface, and P-type silicon will provide a supply of holes. In one approach, the EMF is the band offset between the Fermi levels in the N-type and P-type silicon, which is equivalent to approximately 1eV. The N-type silicon will act as the anode, while the P-type silicon will act as the cathode in this RedOx reaction. When the substrates are immersed in a chemical solution to allow charge transfer in the solution, complex chemical reactions occur.

As a result, a chemical process is occurring along a thin boundary layer in the solution directly in contact with the silicon surface. Along this boundary, the aqueous ammonia oxidizes the silicon to form $SiO_2$. The presence of dopants changes the resistivity of the silicon, thus, higher active dopant concentrations increase the current density, which is proportional to the oxidation and dissolution rate of the silicon.

The higher the doping concentration, the greater the dissolution rate. For P+ silicon, if the doping concentration is not high enough, there will not be a great enough supply of holes to etch the $SiO_2$, and the passivation layer will not be removed. This will inhibit the etching of P+ silicon.

It has been observed that the selective etching may be P-type over N-type, or N-type over P-type depending on the solution temperature, flow rate of the aqueous ammonia, concentration of the aqueous ammonia, agitation, or illumination of light.

Assuming that the EMF potential is originating from the difference in $E_{fermi}$ between N and P silicon, then a method that reduces or nullifies the potential difference between $E_{fermi}$ to $E_{intrisic}$ could be used to reduce the etch selectivity between N- and P-type regions. In other words, a method that inactivates the silicon can be used. One method of inactivating silicon is to bombard the silicon surface with heavy ions, such as Si, Ge or Xe. This destroys the silicon crystallinity, and inactivates the dopants, thus eliminating the supply of electrons in the N area (dissolution substrate), and eliminating the holes in the P area (passivation substrate). By amorphizing the silicon in this manner to a pre-defined depth, unbiased etching to the depth of the amorphized silicon can be achieved.

In one embodiment, N- and P-type extensions formed in the source/drain regions are implanted with the Xe, at a dose of 2E14 and energy of 10 keV, to create an amorphous depth of 100 A. Reference to FIG. 6, N and P-type regions are represented by extensions 36 and 46 respectively. Results indicate a significant reduction in the etch bias subsequent to inactivating the surface regions. For example, when a sample is not amorphized, the N area will etch 100A, while the P area will etch little or none at all. For a surface that is amorphized, the N area will etch 110A, while the P area will etch 80A (see FIG. 2). As a result, the final silicon thickness is much closer between N and P areas, after SEG growth, when the substrate is amorphized, as compared to when it is not amorphized.

The resulting SEG morphology was smooth in the P area, even with an 800° C. $H_2$ bake. Previously, this low bake temperature resulted in a rough surface when a wet clean only was applied. Lower bake temperatures are expected down to approximately to 750° C. Though not specifically illustrated, it will be appreciated that the gate structures may be masked during the implementation process.

The method and apparatus herein provides for a flexible implementation. Although described using certain specific examples, it will be apparent to those skilled in the art that the examples are illustrative, and that many variations exist. For example, the disclosure is discussed herein primarily with regard to a cleaning process following offset spacer formation which results in a surface suitable for selective epitaxial growth (SEG) and does not require an additional post-offset spacer clean for a CMOS device, however, the disclosure can be employed with other device technologies. Additionally, various types of deposition and etch devices are currently available which could be suitable for use in employing the method as taught herein. Note also, that although an embodiment of the present disclosure has been shown and described in detail herein, along with certain variants thereof, many other varied embodiments that incorporate the teachings of the disclosure may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

What is claimed is:

1. A method of manufacturing a semiconductor device comprising:
   forming a gate structure overlying a substrate;
   exposing a source/drain region of the substrate to a first solution comprising ammonium hydroxide, hydrogen peroxide, and deionized water mixture to etch an upper-most semiconductor portion of the source/drain region; and
   forming an epitaxial layer overlying the source/drain region subsequent to exposing the source/drain region to the first solution.

2. The method of claim 1 wherein exposing includes the first solution comprising an initial ratio of ammonium hydroxide, hydrogen peroxide, and deionized water mixture of 1–4:1–4:6–40, wherein an initial concentration of hydrogen peroxide is greater than approximately $3 \times 10^{-3}$M, and exposing further comprises allowing the initial concentration of hydrogen peroxide to be depleted to facilitate etching of the upper-most semiconductor portion.

3. The method of claim 1, further comprising implanting the source/drain extension region with a dopant prior to forming the epitaxial layer.

4. The method of claim 1, wherein exposing comprises exposing the source/drain to the first solution for more than 60 minutes.

5. The method of claim 1, wherein forming the gate structure further comprises forming the gate structure to comprise a gate offset spacer.

6. The method of claim 5, wherein the gate offset spacer comprises a nitride.

7. The method of claim 5, wherein the gate offset spacer comprises an outer-most nitride portion.

8. The method of claim 1, further comprising:
   implanting the source/drain region with a dopant prior to exposing.

9. The method of claim 8, wherein implanting includes implanting a source/drain dopant.

10. The method of claim 1, further comprising:
    exposing the source/drain region to a second solution comprising hydrogen fluoride prior to exposing to the first solution and subsequent to forming the gate structure.

11. The method of claim 10, further comprising:
    exposing the source/drain region to a third solution comprising hydrochloric acid, hydrogen peroxide, and $H_2O$ subsequent to exposing to the first solution.

12. The method of claim 11 further comprising:
    exposing the source drain region to fourth solution comprising hydrogen fluoride subsequent to exposing to the third solution.

13. The method of claim 12 wherein forming the gate structure overlying the substrate includes the substrate being a semiconductor-on-insulator substrate.

14. The method of claim 13 wherein forming the gate structure includes the semiconductor-on-insulator substrate being a silicon-on-insulator substrate.

15. The method of claim 11 wherein forming the gate structure overlying the substrate includes the substrate being a semiconductor-on-insulator substrate.

16. The method of claim 12 wherein forming the gate structure further comprises forming the gate structure to comprise a gate offset spacer comprising an outer-most nitride portion.

17. The method of claim 12 further comprising:
    implanting the source/drain region prior to exposing to the first solution with a dopant to facilitate forming an extension region.

18. A method comprising:
    forming a gate structure overlying a substrate comprising a semiconductor-on-insulator substrate;
    rinsing an upper-most surface of the substrate with water;
    etching an upper-most surface of the substrate using a first solution comprising hydrogen fluoride;
    rinsing the upper-most surface of the substrate with water after etching using the first solution;
    etching the upper-most surface of the substrate using a second solution comprising ammonium hydroxide, hydrogen peroxide, and water, with a ratio of hydrogen peroxide to water being in the range of approximately 1–4:6–40;
    rinsing the upper-most surface of the substrate with water after etching using the second solution;
    etching the upper-most surface of the substrate using a third solution comprising hydrogen fluoride; and
    rinsing the upper-most surface of the substrate with water after etching using the third solution.

19. The method of claim 18 further comprising:
    doping a portion of the upper-most surface prior to etching using a first solution.

20. A method of manufacturing a semiconductor device comprising:
    forming a gate structure overlying a semiconductor-on-insulator substrate;
    exposing a source/drain region of the substrate to a first solution comprising ammonium hydroxide, hydrogen peroxide, and deionized water mixture to etch an upper-most semiconductor portion of the source/drain region, with a ratio of hydrogen peroxide to water being in the range of approximately 1–4:6–40;
    exposing the source/drain region to a second solution comprising hydrogen fluoride prior to exposing to the first solution and subsequent to forming the gate structure;
    exposing the source/drain region to a third solution comprising hydrochloric acid:hydrogen peroxide:$H_2O$ subsequent to exposing to the first solution; and
    exposing the source drain region to fourth solution comprising hydrogen fluoride subsequent to exposing to the third solution.

21. A method of manufacturing a semiconductor device comprising:
    forming a gate structure overlying a semiconductor-on-insulator substrate, wherein the gate structure comprises a gate offset spacer comprising an outer-most nitride portion;
    exposing a source/drain region to a first solution comprising hydrogen fluoride prior subsequent to forming the gate structure; and
    exposing the source/drain region to a second solution subsequent to exposing the source/drain region to the first solution, the second solution comprising ammonium hydroxide, hydrogen peroxide, and deionized water mixture to etch an upper-most semiconductor portion of the source/drain region, wherein the gate structure substantially is subsequent to exposing the source/drain region to the second solution, and a ratio of hydrogen peroxide to water being in the range of approximately 1–4:6–40.

22. The method of claim 21, further comprising:
exposing the source/drain region to a third solution comprising hydrochloric acid, hydrogen peroxide, and $H_2O$ subsequent to exposing to the first solution.

23. The method of claim 22, further comprising:
exposing the source drain region to fourth solution comprising hydrogen fluoride subsequent to exposing to the third solution.

24. The method of claim 23, further comprising:

implanting the source/drain region prior to exposing to the first solution with a dopant to facilitate forming an extension region.

* * * * *

UNITED STATES PATENT AND TRADEMARK OFFICE
CERTIFICATE OF CORRECTION

| | | |
|---|---|---|
| PATENT NO. | : 7,241,700 B1 | Page 1 of 1 |
| APPLICATION NO. | : 10/969769 | |
| DATED | : July 10, 2007 | |
| INVENTOR(S) | : William George En et al. | |

It is certified that error appears in the above-identified patent and that said Letters Patent is hereby corrected as shown below:

Column No. 10, Line No. 64, change "is" to --remains--

Signed and Sealed this

Thirtieth Day of October, 2007

JON W. DUDAS
*Director of the United States Patent and Trademark Office*